(12) United States Patent
Suto

(10) Patent No.: US 6,774,716 B2
(45) Date of Patent: Aug. 10, 2004

(54) FEEDFORWARD AMPLIFIER CIRCUITRY

(75) Inventor: Masaki Suto, Tokyo (JP)

(73) Assignee: Hitachi Kokusai Electric Inc., Tokyo (JP)

(*) Notice: Subject to any disclaimer, the term of this patent is extended or adjusted under 35 U.S.C. 154(b) by 0 days.

(21) Appl. No.: 10/303,917

(22) Filed: Nov. 26, 2002

(65) Prior Publication Data
US 2003/0174017 A1 Sep. 18, 2003

(30) Foreign Application Priority Data
Mar. 15, 2002 (JP) ........................................ 2002-072054

(51) Int. Cl.[7] .................................................. H03F 3/66
(52) U.S. Cl. ........................... 330/52; 330/151; 375/297
(58) Field of Search ........................ 330/52, 151, 149; 375/297

(56) References Cited

U.S. PATENT DOCUMENTS 5,166,634 A * 11/1992 Narahashi et al. .......... 330/151
5,532,642 A * 7/1996 Takai .......................... 330/151
6,011,434 A * 1/2000 Sakai .......................... 330/151

FOREIGN PATENT DOCUMENTS

JP 3106996 9/2000
JP 2003-92517 3/2003

* cited by examiner

Primary Examiner—Henry Choe
(74) Attorney, Agent, or Firm—McGinn & Gibb, PLLC

(57) ABSTRACT

The present invention is intended to provide a feedforward amplifier circuitry which is capable of changing a location or placement of each section constituting the feedforward circuitry, in particular a feedforward amplifier circuitry which is capable of changing an interposing location of a variable phase shifter. In the feedforward amplifier circuitry, a variable phase shifters (5, 12) can be disposed on a location other than a post-stage of a predistortion circuits (3, 20), as a result of which it is advantageously possible to provide a designer with more flexibility in changing the locations of variable shifters, regardless of the conventional arrangement of the variable phase shifters disposed on the post-stages of the distortion circuits, when the feedforward amplifier is actually designed.

2 Claims, 12 Drawing Sheets

FEEDFORWARD AMPLIFIER CIRCUITRY

BACKGROUND OF THE INVENTION

1. Field of the Invention

The present invention relates to a feedforward amplifier circuitry and, in particular the present invention relates to a feedforward amplifier circuitry capable of removing or eliminating a distortion component of an amplifier by using predistortion compensating mean.

2. Description of the Related Art

FIGS. 9 and 10 illustrate block circuit diagrams showing feedforward amplifier circuitries as disclosed in Japanese Patent No. 3106996.

Referring to FIG. 9, an input signal from an input terminal 1 is distributed via a distributor 2 to signal paths a and b. The signal outputted on the signal path a passes through a predistortion circuit 3, a variable attenuator 4 and a variable phase shifter 5 and then receives an injection of a pilot signal generated from a pilot signal generator 16, thereafter inputted into a main amplifier 6. As is clear from FIG. 9, the variable attenuator 4 and the variable phase shifter 5 are controlled by a control circuit 19.

Subsequently, an output from the main amplifier 6 is inputted into a distributor 7 one distributed output of which is fed through a delay line 8 to a combiner 9 and the other distributed output of which is fed to a combiner 11. The combiner 11 combines a signal passed through a delay line 10 with an output from the distributor 7. An output of the combiner 11 passes through a variable attenuator 12 and a variable phase shifter 13, thereafter inputted into an auxiliary amplifier 14. As is clear from FIG. 9, the variable attenuator 12 and the variable phase shifter 13 is controlled by the control circuit 19.

An output from the auxiliary amplifier 14 is combined with a signal passed through the delay 8 by the combiner 9, thereafter outputted from an output terminal 15. From an output point of the combiner 11, a carrier component (which is a single frequency component of a signal to be fed into the input terminal 1 and to be amplified) is detected and then a level of its detected carrier component is inputted into the control circuit 19. Also, from an output point of the combiner 9, a level of the pilot signal which has been injected into an output from the variable phase shifter 5 is detected by a pilot signal detector 18, thereafter inputted into the control circuit 19. On the other hand, between the combiner 11 and the variable attenuator 12 in a feedforward amplifier circuitry as shown in FIG. 10 is provided a predistortion circuit 20.

In each of the feedforward amplifier circuitries as shown in FIGS. 9 and 10, the main amplifier 6 and the auxiliary amplifier 14 change in operating point dependently on their temperature characteristics in accordance with an ambient temperature variation, as a result of which each of the feedforward amplifier circuitries can disadvantageously shift its optimal point for eliminating or removing a distortion as a whole.

Thus, the applicant proposes a feedforward amplifier circuit having a predistortion temperature compensating circuit 21 arranged therein as shown in FIGS. 11 and 12 and which has already been filed as Japanese Patent Application HEI-2001-281906.

The feedforward amplifier circuitries as shown in FIGS. 11 and 12 are substantially similar to those as shown in FIGS. 9 and 10, but distinguish from the latter in that the predistortion temperature compensating circuits 21 are provided for the predistortion circuits 3, respectively.

The feedforward amplifier circuits as shown in FIGS. 11 and 12 exhibit good performances without shifting in optimal point for eliminating distortions in accordance with the ambient temperature. However, the fact which is common to both of the feedforward amplifier circuitries as shown in FIGS. 9 to 12 is that, upon implementation of actual circuit composition for such a feedforward amplifier circuit on a circuit board, a problem rises such that there is present lack of flexibility in terms of a location (or placement) of each section which partially configures the feedforward circuitry without any reverse influence on the completed feedforward amplifier circuit.

The present invention aims to solve or at least reduce this problem. It is, therefore, an object of the present invention to provide a feedforward amplifier circuitry which is capable of changing a location of each section which partially configures the feedforward circuitry and, in particular, a feedforward amplifier circuitry which is capable of changing an interposing location of a variable phase shifter.

SUMMARY OF THE INVENTION

According to an aspect of the present invention, there is provided a feedforward amplifier circuitry comprising:

a distortion detecting means for detecting a distortion component in an output signal of an amplifier;

a distortion eliminating means for eliminating the distortion component in the output of said amplifier by subtracting a signal based on the distortion component detected by said distortion detecting means from the output signal of said amplifier;

a pre-stage distortion compensating means disposed at least on either one side of said distortion detecting means and said distortion eliminating means and generating a distortion component to be eliminated as the distortion component of said amplifier; and a variable phase shifter means disposed at least on either one side of said distortion detecting means and said distortion eliminating means, wherein said variable phase shifter means disposed on either one side of said distortion detecting means and said distortion eliminating means, if said pre-stage distortion compensating means is disposed on either one side thereof, is disposed on a location other than a post-stage of said pre-stage distortion compensating means.

Thus, the feedforward amplifier circuitry according to the present invention allows the variable phase shifter to be disposed on an appropriate location. Therefore, it is possible to provide a designer with more flexibility in changing a location or placement of the variable phase shifter, regardless of the conventional arrangement of the variable phase shifter disposed on the post-stage of the distortion circuit when the feedforward amplifier is actually designed, without any reverse influence on the feedforward amplifier circuit.

According to another aspect of the present invention, there is further provided a feedforward amplifier circuitry comprising:

a distortion detecting means for detecting a distortion component in an output signal of an amplifier;

a distortion eliminating means for eliminating the distortion component in the output of said amplifier by subtracting a signal based on the distortion component detected by said distortion detecting means from the output signal of said amplifier;

a pre-stage distortion compensating means disposed at least on either one side of said distortion detecting means and said distortion eliminating means and generating a distortion component to be eliminated as the distortion component of said amplifier;

temperature compensating means for adding a temperature compensation function to said pre-stage distortion compensating means such that the distortion component generated by said pre-stage distortion compensating means is optimized according to an ambient temperature; and a variable phase shifter means disposed at least on either one side of said distortion detecting means and said distortion eliminating means, wherein said variable phase shifter means disposed on either one side of said distortion detecting means and said distortion eliminating means, if said pre-stage distortion compensating means is disposed on either one side thereof, is disposed on a location other than a post-stage of said pre-stage distortion compensating means.

Thus, the feedforward amplifier circuitry according to the present invention allows not only the variable phase shifter to be disposed on an appropriate location, but also the pre-stage distortion compensating means to be optimally controlled for eliminating the distortion component in the output signal of the amplifier by means of the temperature compensation function of the temperature compensating means. Similarly to the above configuration of the feedforward amplifier circuitry, it is also possible to provide a designer with more flexibility in changing a location or placement of the variable phase shifter, regardless of the conventional arrangement of the variable phase shifter disposed on the post-stage of the distortion circuit when the feedforward amplifier is actually designed, without any reverse influence on the feedforward amplifier circuit.

These and other aspects of the present invention will be apparent from the following specific description, given by way of example, with reference to the accompanying drawings.

DESCRIPTION OF PREFERRED EMBODIMENTS

Hereinafter, preferred embodiments of the present invention will be described in detail with reference to the accompanying drawings.

Figure 1:
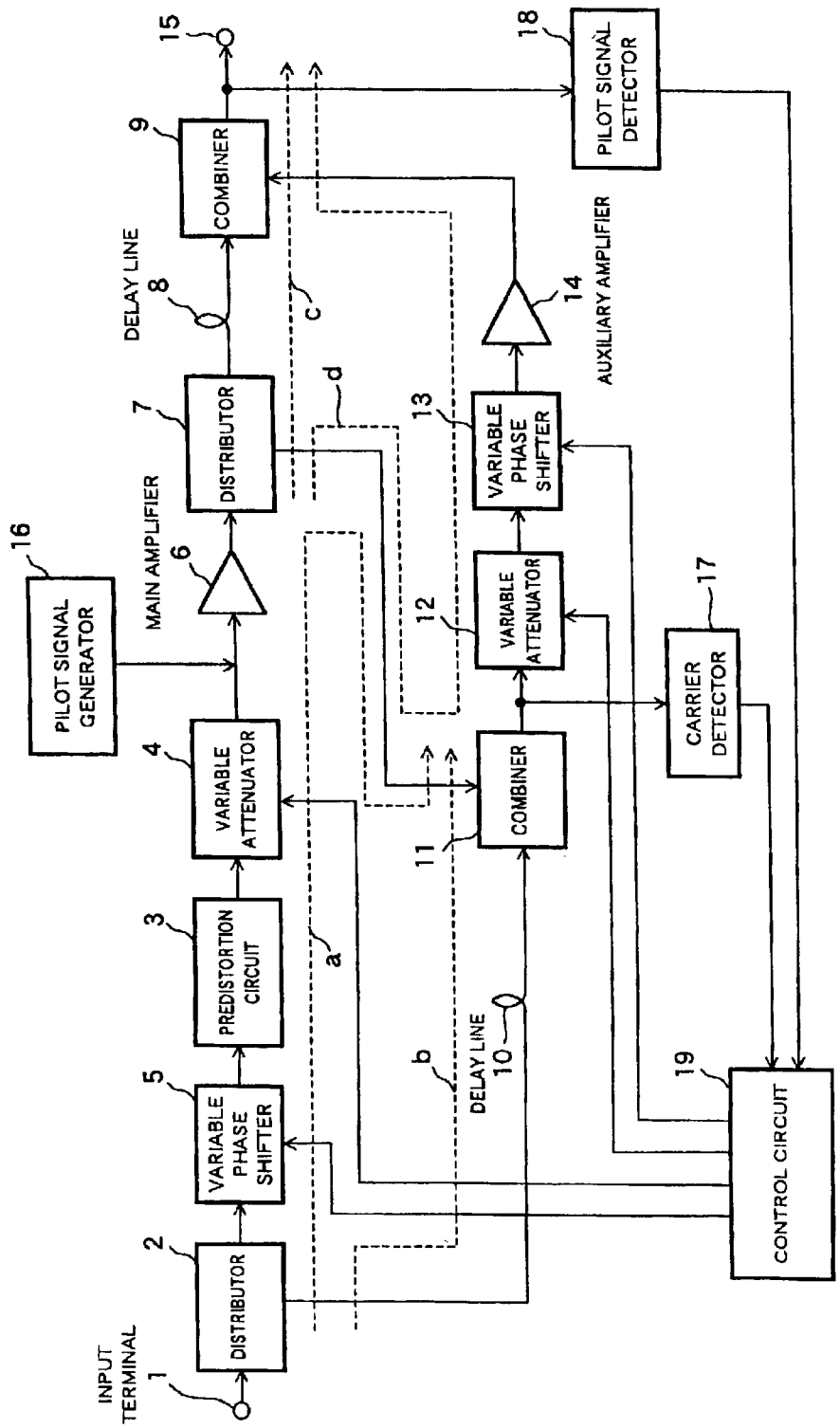
FIG. 1 is a schematic block diagram showing a feedforward amplifier circuitry of an embodiment 1 according to the present invention.
Figure 2:
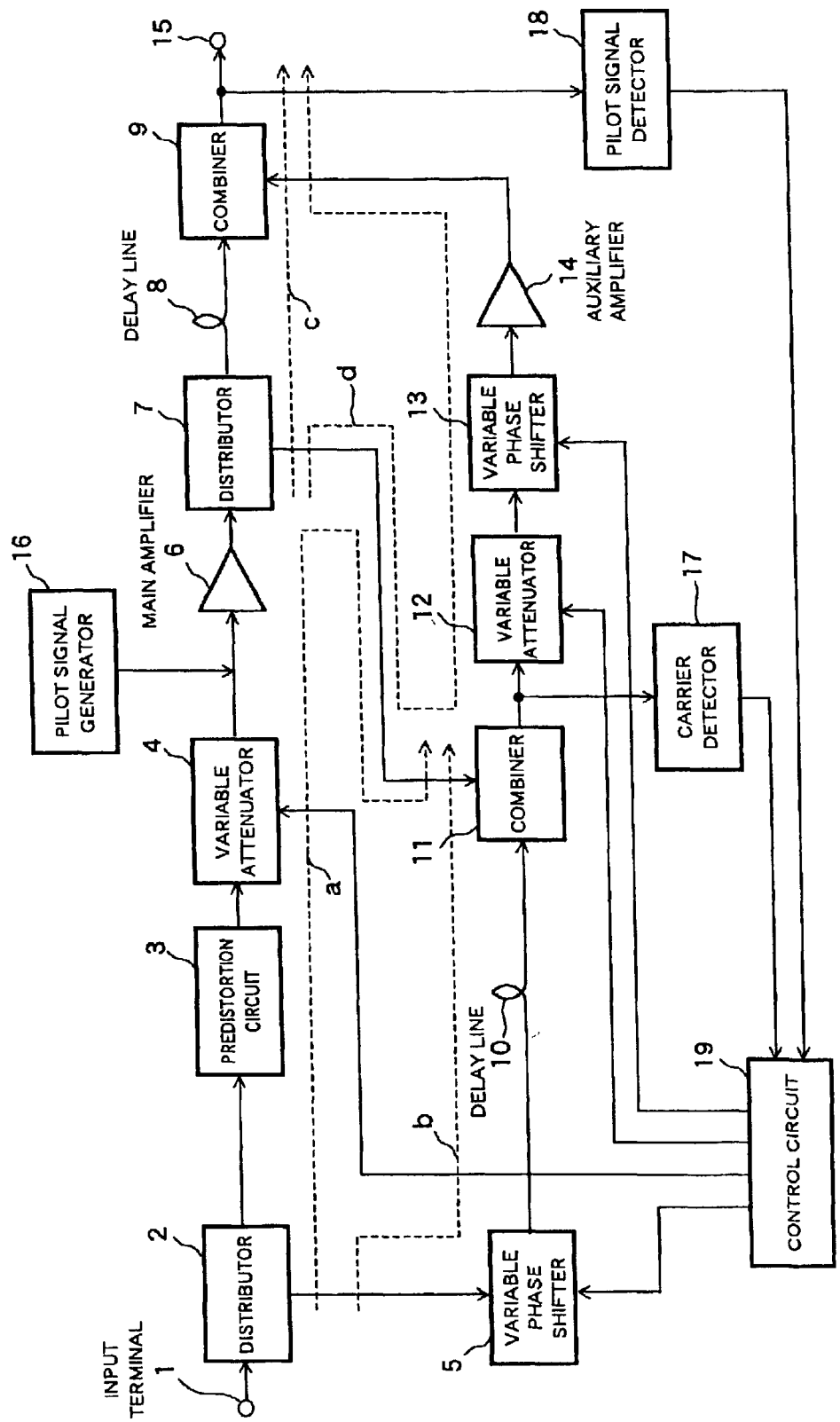
FIG. 2 is a schematic block diagram showing a feedforward amplifier circuitry of an embodiment 2 according to the present invention.
Figure 3:
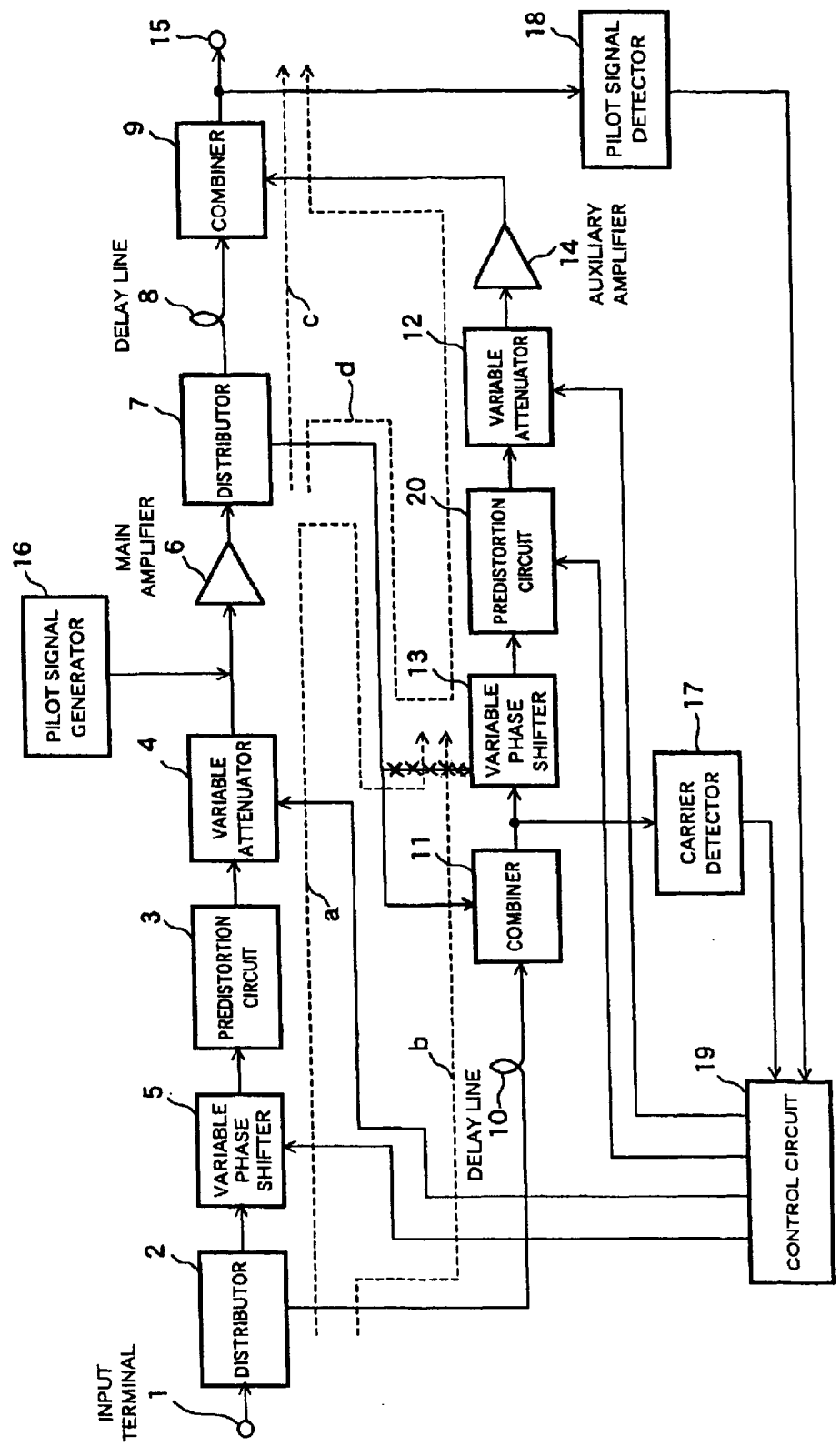
FIG. 3 is a schematic block diagram showing a feedforward amplifier circuitry of an embodiment 3 according to the present invention.
Figure 4:
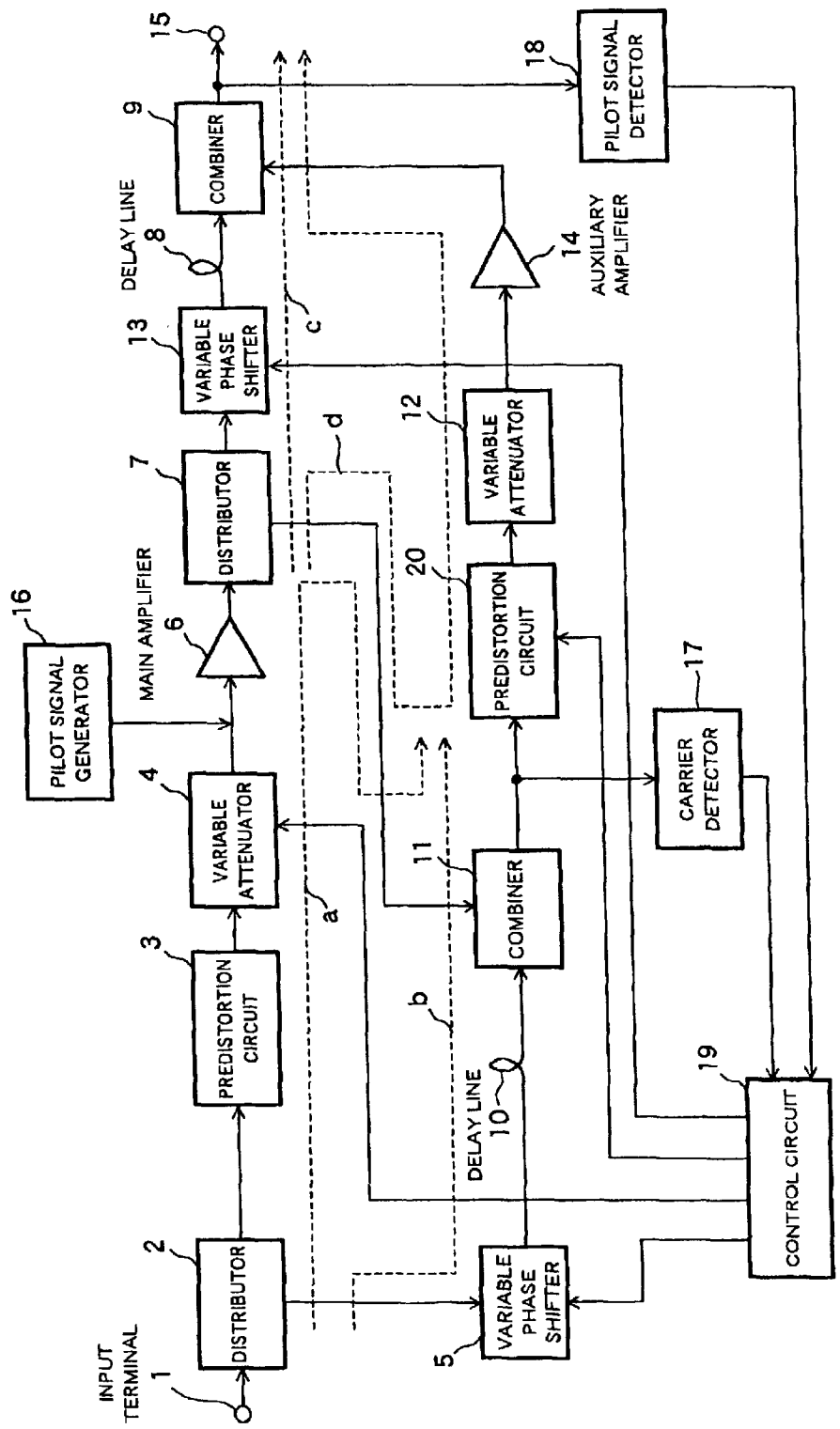
FIG. 4 is a schematic block diagram showing a feedforward amplifier circuitry of an embodiment 4 according to the present invention.
Figure 5:
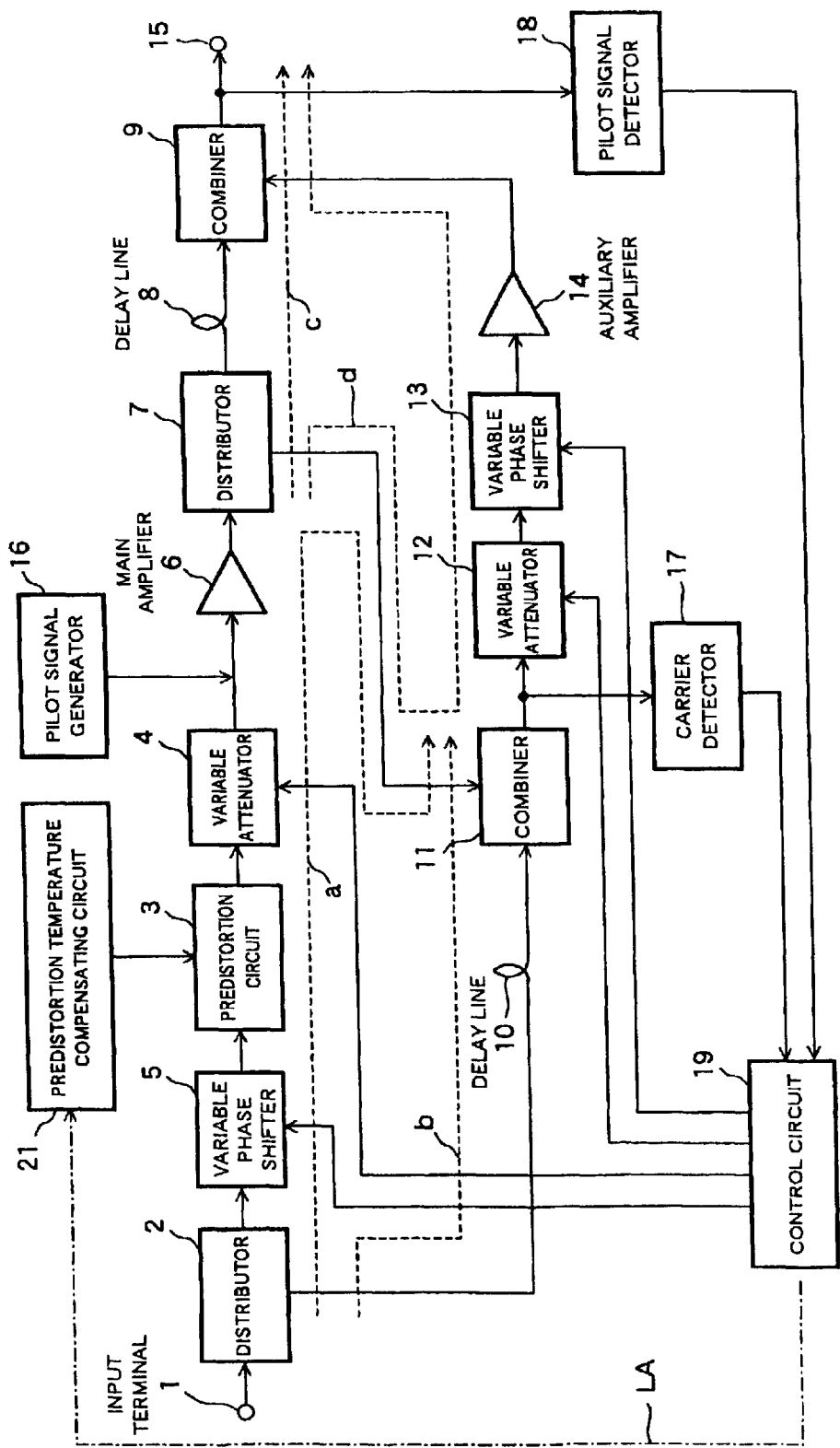
FIG. 5 is a schematic block diagram showing a feedforward amplifier circuitry of an embodiment 5 according to the present invention.
Figure 6:
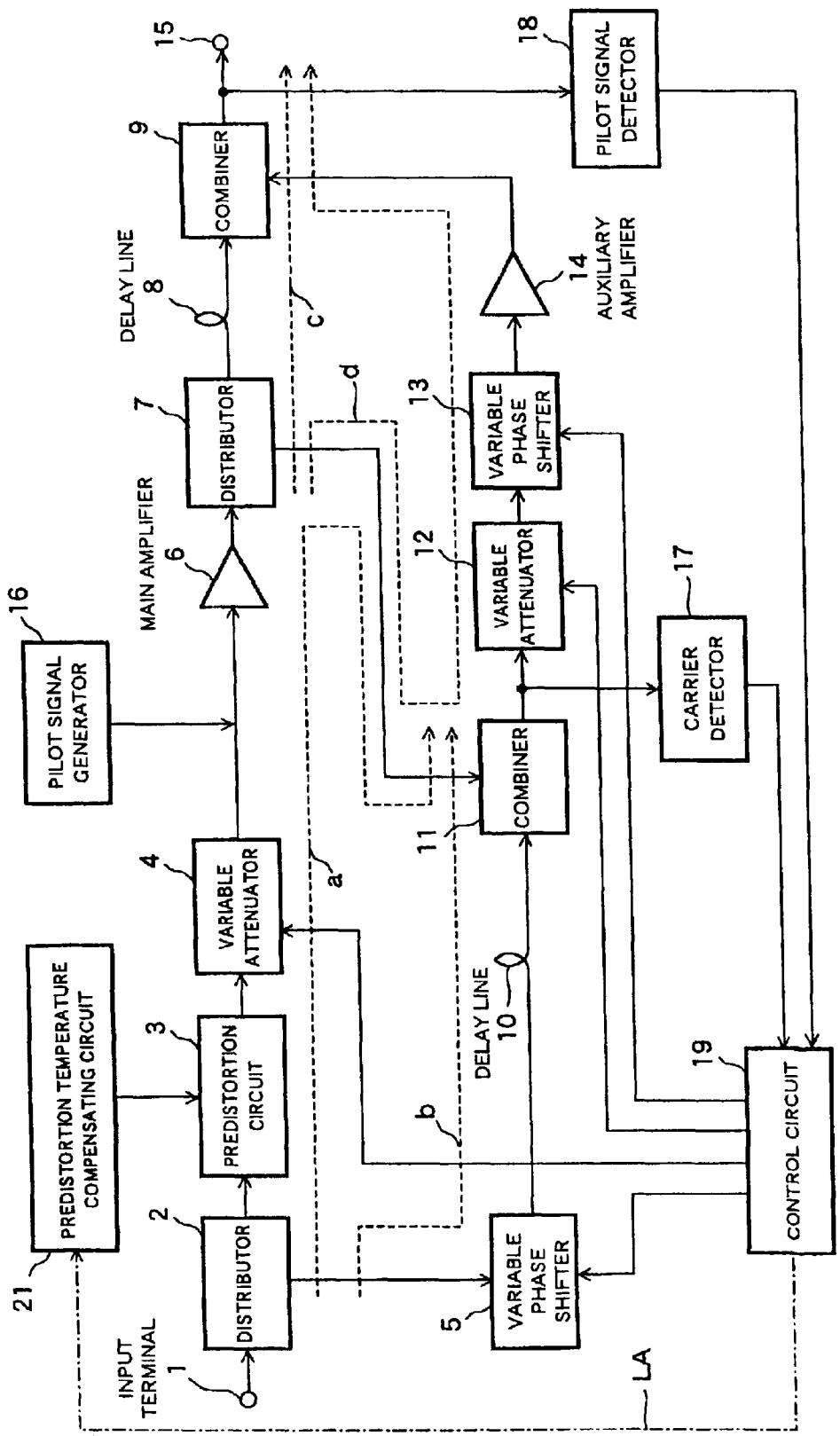
FIG. 6 is a schematic block diagram showing a feedforward amplifier circuitry of an embodiment 6 according to the present invention.
Figure 7:
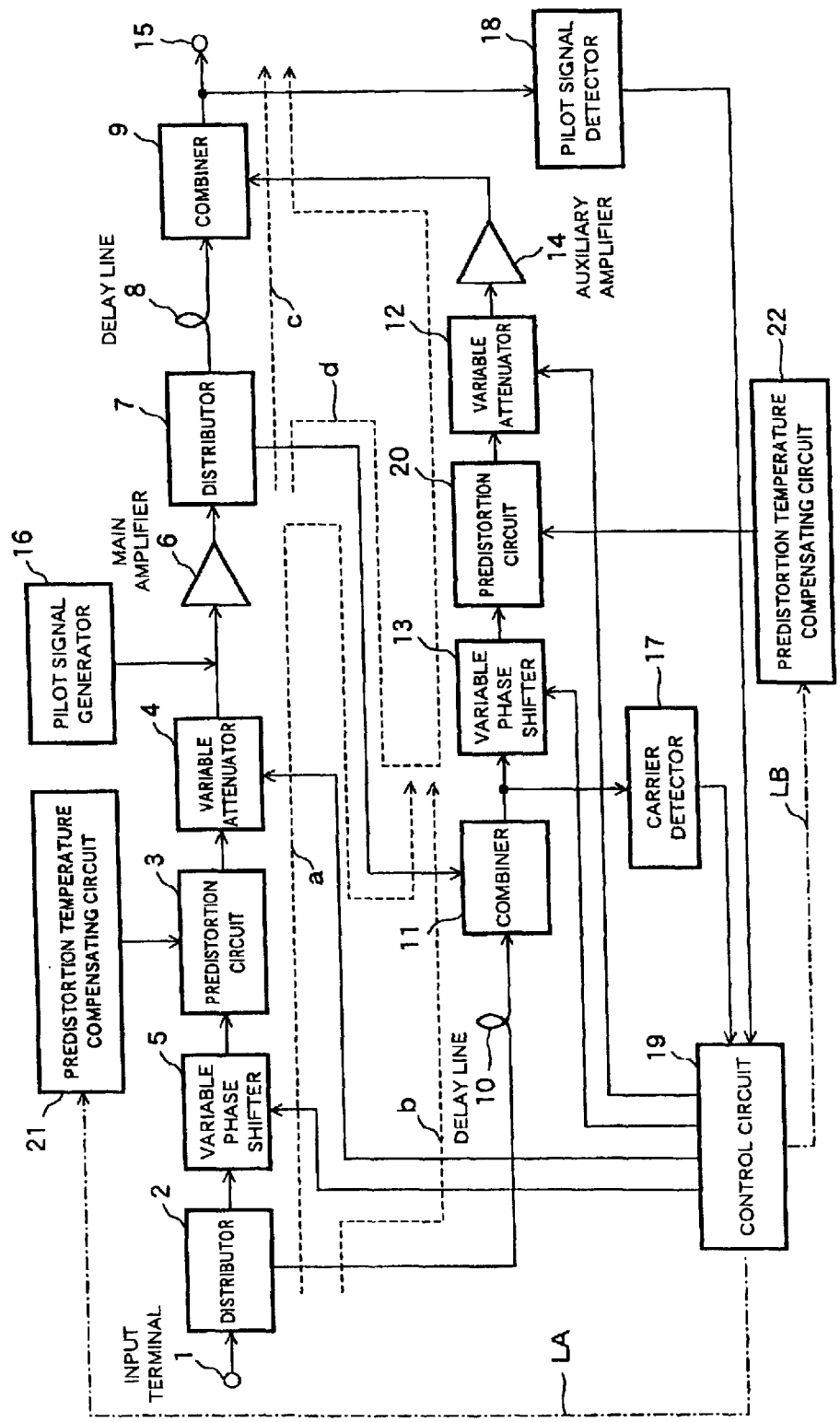
FIG. 7 is a schematic block diagram showing a feedforward amplifier circuitry of an embodiment 7 according to the present invention.
Figure 8:
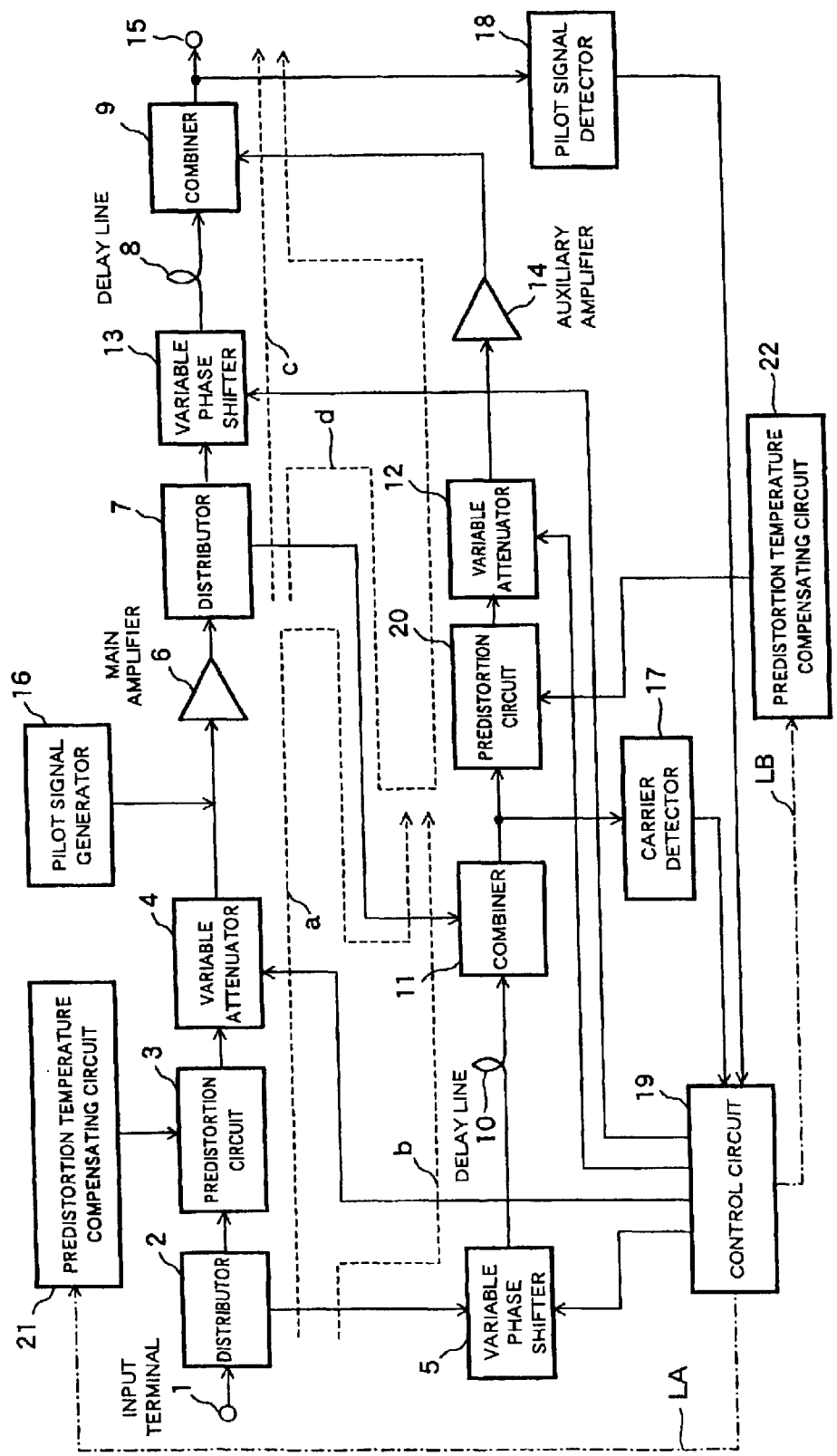
FIG. 8 is a schematic block diagram showing a feedforward amplifier circuitry of an embodiment 8 according to the present invention.

FIG. 1 is a schematic block diagram showing a feedforward amplifier circuitry of an embodiment 1 according to the present invention; FIGS. 2 to 4 are schematic block diagrams showing feedforward amplifier circuitries of embodiments 2 to 4 according to the present invention, each being partially similar to the feedforward amplifier circuitry of FIG. 1; FIG. 5 is a schematic block diagram showing a feedforward amplifier circuitry of an embodiment 5 according to the present invention; FIGS. 6 to 8 are schematic block diagrams showing feedforward amplifier circuitries of embodiments 6 to 8 according to the present invention, each being partially similar to the feedforward amplifier of FIG. 5. In these Figures, similar reference numerals are used to identify similar sections or parts.

Embodiment 1:

Hereinafter, a feedforward amplifier of an embodiment 1 according to the present invention will be described with reference to FIG. 1.

Figure 9:
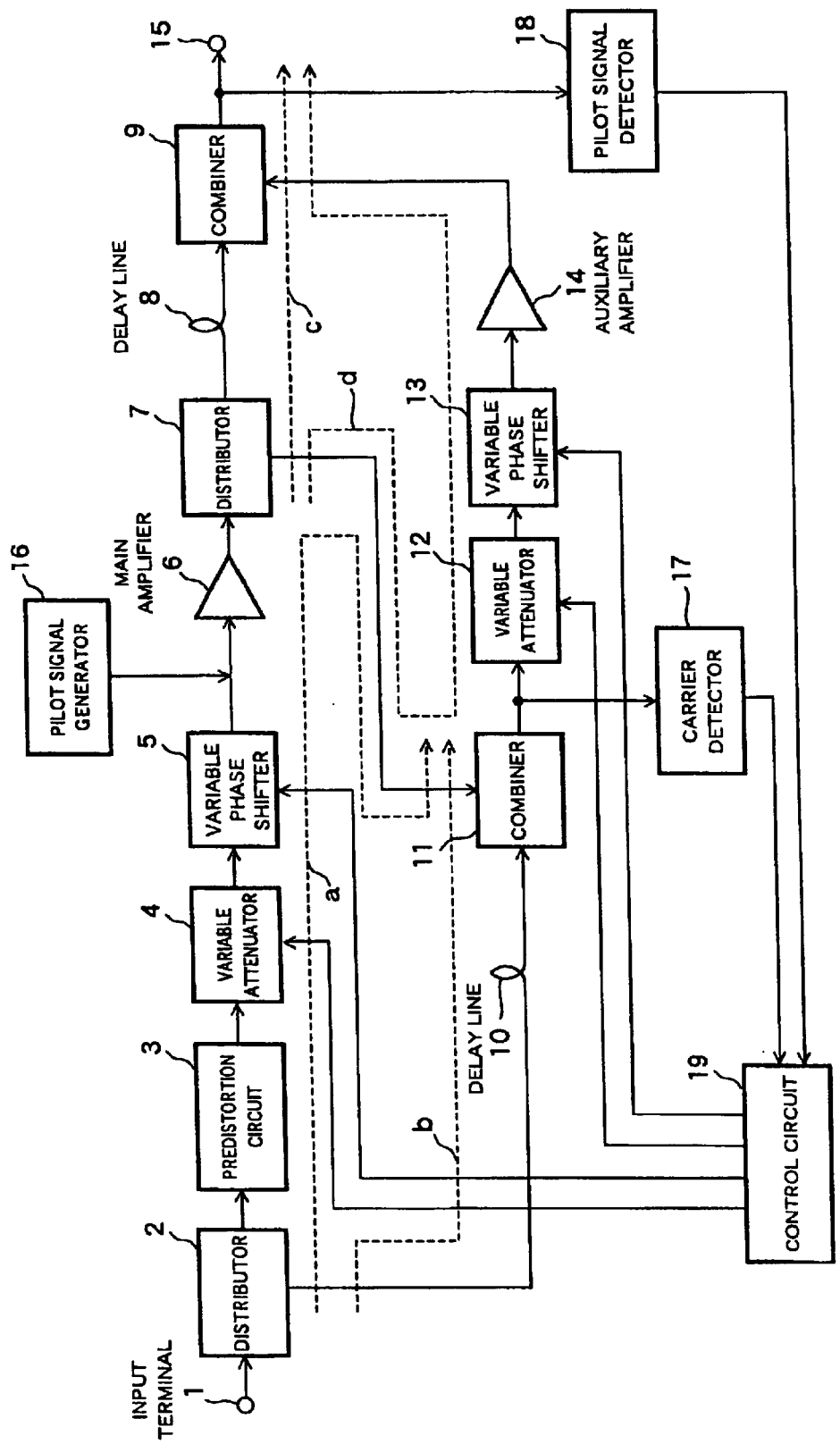
FIG. 9 is a schematic block diagram showing a conventional feedforward amplifier circuitry.

The feedforward amplifier circuitry as shown in FIG. 1 is a modified form of the feedforward amplifier circuitry of FIG. 9. In the feedforward amplifier circuitry of FIG. 1, an input signal from an input terminal 1 is distributed via a distributor 2 to signal paths a and b. The signal outputted on the signal path a passes through a variable phase shifter 5, a predistortion circuit (a pre-stage distortion compensating circuit) 3, a variable attenuator 4 and then receives an injection of a pilot signal generated from a pilot signal generator 16, thereafter inputted into a main amplifier 6.

An output from the main amplifier 6 is inputted into a distributor 7 and then distributed to signal paths c and d. A signal outputted on the signal path c is fed through a delay line 8 into a combiner 9 while a signal outputted on the signal path d is inputted into a combiner 11. The combiner 11 combines a signal passed through a delay line 10 with an output signal from the distributor 7. An output from the combiner 11 is inputted through a variable attenuator 12 and a variable phase shifter 13 into an auxiliary amplifier 14. As is clear from FIG. 1, the variable attenuator 12 and the variable phase shifter 13 are controlled by a control circuit 19.

An output from the auxiliary amplifier 14 is combined with a signal passed through the delay line 8 by the combiner 9, thereafter outputted from an output terminal 15. From an output point of the combiner 11, a carrier component (which is a single frequency component of a signal to be fed into the input terminal 1 and to be amplified) is detected by a carrier detector 17 and then a level of its detected carrier component is inputted into the control circuit 19. Also, from an output point of the combiner 9, a level of the pilot signal is detected by a pilot detector 18, thereafter inputted into the control circuit 19.

With respect to the detected carrier level of the above case, the control circuit 19 controls the variable attenuator 4 and the variable phase shifter 5 so as to minimize an output from the carrier detector 17, as a result of which the signal on the signal path a becomes the same amplitude as the signal on the signal path b but opposite in phase thereto and then an only distortion component of the main amplifier 6 is extracted in an output of the combiner 11. Also, with respect to the detected level of the pilot signal, the control circuit 19 controls the variable attenuator 12 and the variable phase shifter 13 so as to minimize an output from the pilot signal detector 18, as a result of which the signal on the signal path c becomes the same amplitude as the signal on the signal path d but opposite in phase thereto and then a distortion component included on the signal path c is cancelled by a distortion component outputted on the signal path d by the combiner 11 so that an output having no distortion component is outputted from the output terminal 15.

Since feedforward amplifier circuitries of embodiments 2–4 as described below are substantially similar in principle to the feedforward amplifier circuitry of FIG. 1, explanations in principle are omitted in the description regarding the following embodiments 2–4.

Embodiment 2:

Next, a feedforward amplifier circuitry of an embodiment 2 according to the present invention will be described with reference to FIG. 2. In comparison with the feed forward amplifier circuitry of FIG. 9, the feedforward amplifier circuit of FIG. 2 is different therefrom in that a variable phase shifter 5 in the feedforward amplifier of FIG. 2 is not disposed on a signal path a but is disposed on a signal path b. Accordingly, a control circuit 19 of FIG. 2 controls the variable phase shifter 5 such that a signal on the signal path a becomes opposite in phase to a signal on the signal path b. The feedforward amplifier circuitry of FIG. 2 is identical in performance to that of FIG. 9. In this embodiment 2, it is possible to relocate or move a variable phase shifter 13 from a location as shown in FIG. 2 to a location between a distributor 7 and a delay line 8.

Figure 10:
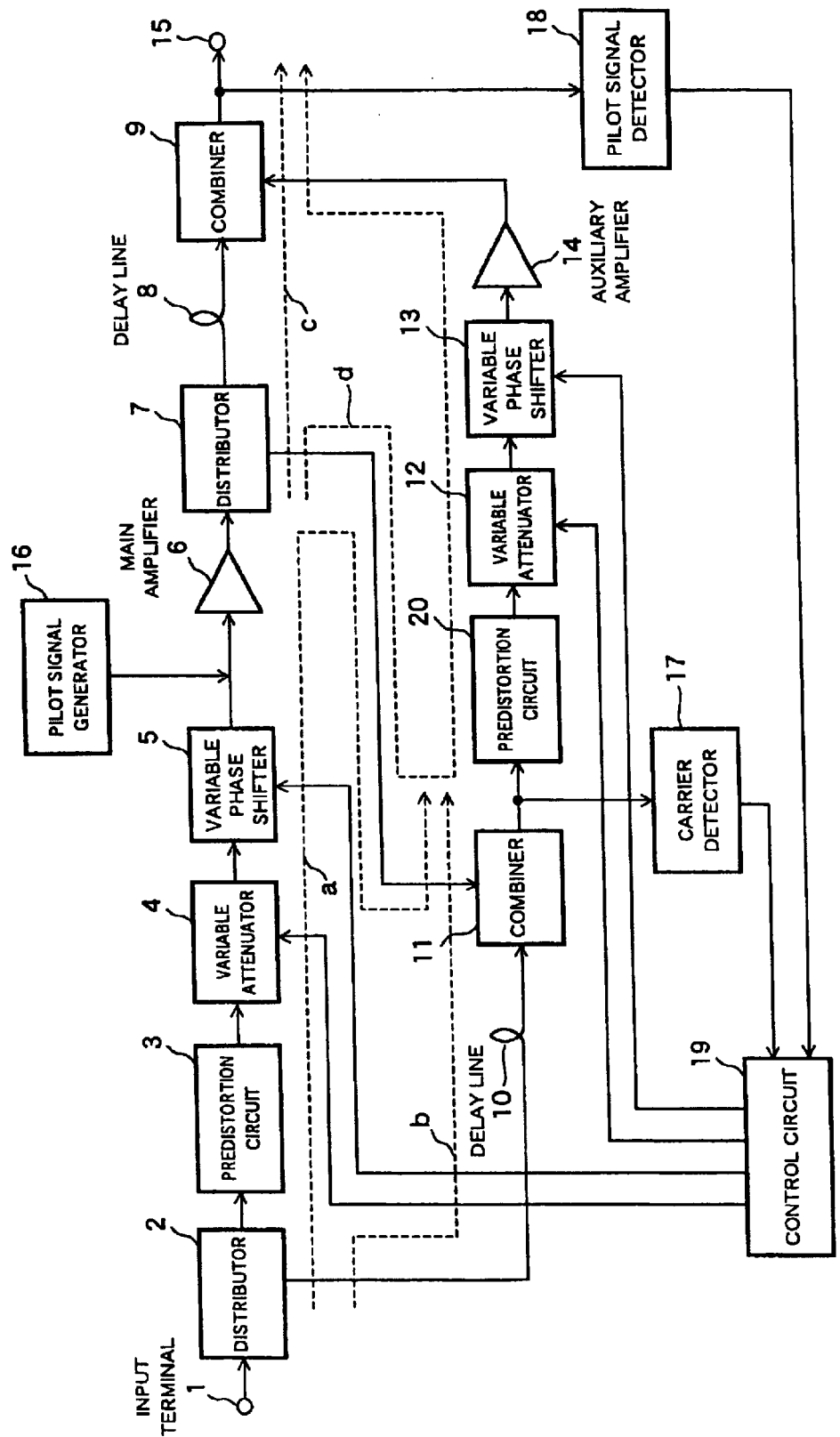
FIG. 10 is a schematic block diagram showing another conventional feedforward amplifier circuitry.

Embodiment 3:

Next, a feedforward amplifier circuitry of an embodiment 3 according to the present invention will be described with reference to FIG. 3.. In comparison with the feed forward amplifier circuitry of FIG. 10, the feedforward amplifier circuit of FIG. 3 is different therefrom in that a variable phase shifter 5 on a signal path a as shown in FIG. 3 is not disposed on a post-stage of a predistortion circuit 3 but is disposed on a pre-stage of the predistortion circuit 3. Also, in comparison with the feedforward amplifier circuitry of FIG. 10, the feedforward amplifier circuit of FIG. 3 is different therefrom in that a variable phase shifter 13 on a signal path d as shown in FIG. 3 is not disposed on a post-stage of a predistortion circuit 20 but is disposed on a pre-stage of the predistortion circuit 20. Accordingly, although each location of the variable shifters 5 and 13 in the feedforward amplifier of FIG. 3 is different from the corresponding one in the feedforward amplifier circuitry of FIG. 10, a control circuit 19 of FIG. 3 controls these variable phase shifters 5 and 13 to perform necessary phase adjustments, as a result of which the feedforward amplifier of FIG. 3 is identical in performance to that of FIG. 10.

Embodiment 4:

Next, a feedforward amplifier circuitry of an embodiment 4 according to the present invention will be described with reference to FIG. 4. In comparison with the feed forward amplifier circuitry of FIG. 10, the feedforward amplifier circuit of FIG. 4 is different therefrom in that a variable phase shifter 5 in the feedforward amplifier of FIG. 4 is not disposed on a signal path a but is disposed on a signal path b. Similarly, a variable phase shifter 13 in the feedforward amplifier of FIG. 4 is not disposed on a signal path d but is disposed on a signal path c. Accordingly, a control circuit 19 of FIG. 4 controls the variable phase shifter 5 disposed on the signal path a such that a signal on the signal path a becomes opposite in phase to a signal on the signal path b. Also, the control circuit 9 of FIG. 4 controls the variable phase shifter 13 disposed on the signal path c such that a signal on the signal path c becomes opposite in phase to a signal on the signal path d. Therefore, although each location of the variable shifters 5 and 13 in the feedforward amplifier of FIG. 4 is different from the corresponding one in the feedforward amplifier circuitry of FIG. 10, the feedforward amplifier of FIG. 4 is identical in performance to that of FIG. 10.

Figure 11:
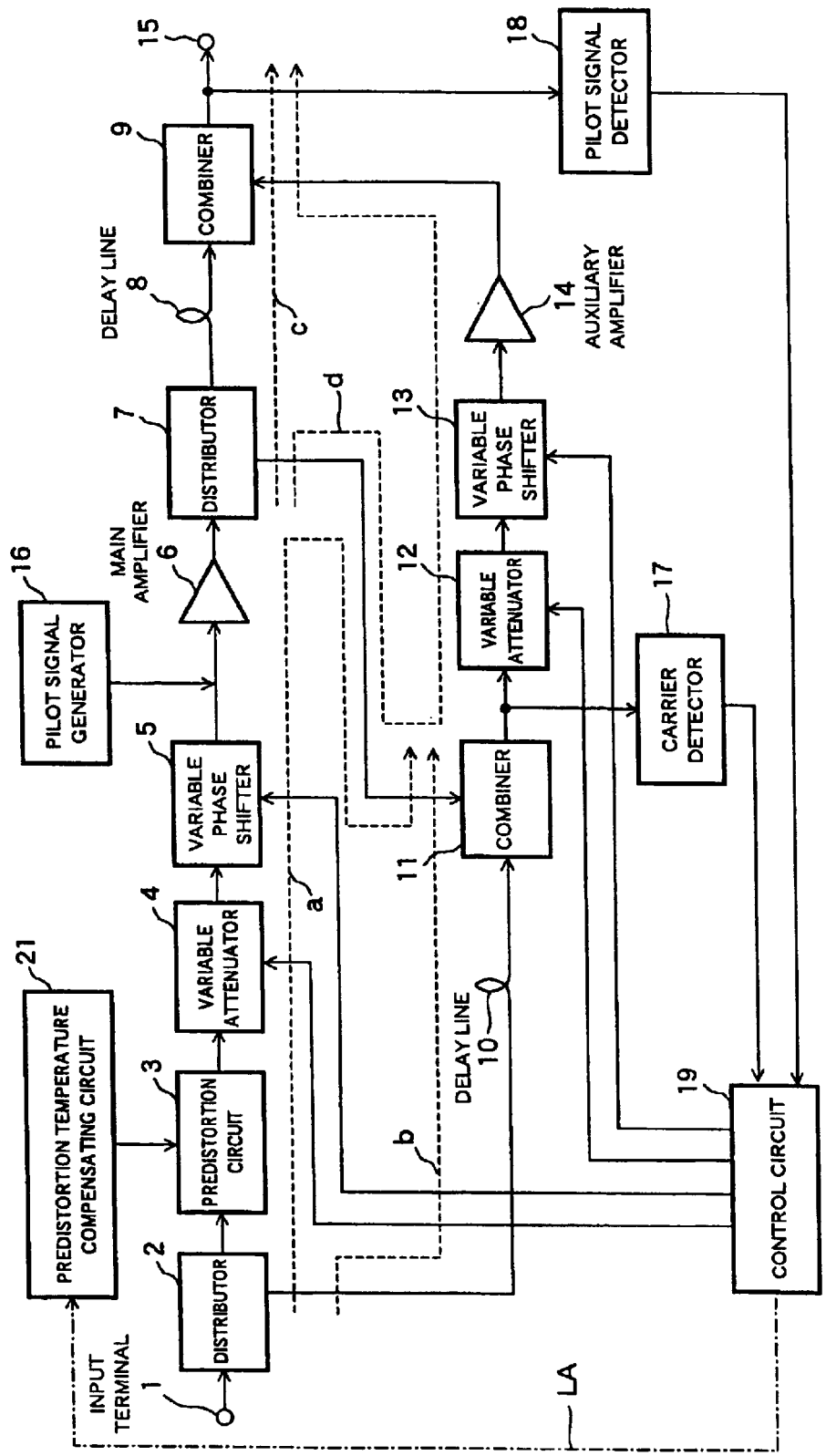
FIG. 11 is a schematic block diagram showing a further conventional feedforward amplifier circuitry.

Embodiment 5:

Next, a feedforward amplifier circuitry of an embodiment 5 according to the present invention will be described with reference to FIG. 5. The feedforward amplifier circuitry as shown in FIG. 5 is a modified form of the feedforward amplifier circuitry of FIG. 11. In the feedforward amplifier circuitry of FIG. 1, an input signal from an input terminal 1 is distributed via a distributor 2 to signal paths a and b. The signal outputted on the signal path a passes through a variable phase shifter 5, a predistortion circuit 3, a variable attenuator 4 and then receives an injection of a pilot signal generated from a pilot signal generator 16, thereafter inputted into a main amplifier 6. In this arrangement, the variable phase shifter 5 and the variable attenuator 4 are controlled by a control circuit 19. The predistortion circuit 3 receives a control signal from a predistortion temperature compensating circuit 21 to adjust an amplitude and phase of a distortion component generated by the predistortion circuit 3 such that a distortion component generated from a main amplifier 6 can optimally be cancelled.

Although the predistortion temperature compensating circuit 21 as described above independently controls the predistortion circuit 3, the predistortion temperature compensating circuit 21 may be configured to control the predistortion circuit 3 with a assistance from the control 19 via a control line LA as denoted by a one-dotted line. An output from the main amplifier 6 is inputted into a distributor 7 and then distributed to signal paths c and d by the distributor 7. A signal outputted on the signal path c is fed through a delay line 8 into a combiner 9 while a signal outputted on the signal path d is inputted into a combiner 11. The combiner 11 combines a signal passed through a delay line 10 with a signal from the distributor 7. An output of the combiner 11 is inputted through a variable attenuator 12 and a variable phase shifter 13 into an auxiliary amplifier 14. In this arrangement, the variable attenuator 12 and the variable phase shifter 13 are controlled by the control circuit 19.

In the combiner 9, an output of the auxiliary amplifier 14 is combined with a signal passed through a delay line 8 and then outputted from an output terminal 15. From an output point of the combiner 11, a carrier component (which is a single frequency component of a signal to be fed into the input terminal 1 and to be amplified) is detected by a carrier detector 17 and then a level of its detected carrier component is inputted into the control circuit 19. Also, from an output point of the combiner 9, a level of a pilot signal is detected by a pilot signal detector 18, thereafter inputted into the control circuit 19.

The control circuit 19 which receives the pilot signal level as described above controls the variable attenuator 4 and the variable phase shifter 5 so as to minimize an output from the carrier detector 17, as a result of which a signal on the signal path a becomes the same amplitude as a signal on the signal path b but opposite in phase thereto and then an only distortion component of the main amplifier 6 is extracted in an output of the combiner 11. Also, the control circuit 19 which has received the detected pilot signal level as described above controls the variable attenuator 12 and the variable phase shifter 13 so as to minimize an output from the pilot signal detector 18, as a result of which a signal on the signal path c becomes the same amplitude as a signal on the signal path d but opposite in phase thereto and then a distortion component included on the signal path c is cancelled by a distortion component outputted on the signal path d by the combiner 11 so that an output having no distortion component is outputted from an output terminal 15.

Thus, in the feedforward amplifier circuitry as shown in FIG. 5, a variable phase shifter 5 is not disposed on a post-stage of the predistortion circuit 3 but is disposed on a pre-stage of the predistortion circuit 3 without any reverse influence on its performance.

Since feedforward amplifier circuitries of embodiments 6–8 as described below are substantially similar in principle to the feedforward amplifier of FIG. 5, the description in principle will be omitted in the following embodiments 6–8.

Embodiment 6:

FIG. 6 is a schematic block diagram showing a feedforward amplifier circuitry of an embodiment 6 according to the present invention. In comparison with the feed forward amplifier circuitry of FIG. 11, a variable phase shifter 5 in the feedforward amplifier circuitry of FIG. 6 is not disposed on a signal path a but disposed on a signal path b. Accordingly, a control circuit 19 of FIG. 6 controls the variable phase shifter 5 disposed on the signal path b such that a signal on the signal path a becomes opposite in phase to a signal on the signal path b. The feedforward amplifier of FIG. 6 is identical in performance to that of FIG. 11.

Embodiment 7:

Next, a feedforward amplifier circuitry of an embodiment 7 according to the present invention will be described with reference to FIG. 7. The feedforward amplifier circuitry as shown in FIG. 7 is a modified form of the feedforward amplifier circuitry of FIG. 12, wherein a predistortion circuit 3, which is under control of a predistortion temperature compensating circuit 21, operates to cancel a temperature variation characteristic of a main amplifier 6 and a predistortion circuit 20, which is under control of a predistortion temperature compensating circuit 22, operates to cancel a temperature variation characteristic of a auxiliary amplifier 14. In comparison with the feed forward amplifier circuitry of FIG. 12, the feedforward amplifier circuitry of FIG. 7 is different therefrom in that a variable phase shifter 5 disposed on a signal path a is not disposed on a post-stage of the predistortion circuit 3 but is disposed on a pre-stage of the predistortion circuit 3 and in that a variable phase shifter 13 on a signal path d is not disposed on a post-stage of the predistortion circuit 20 but is disposed on a pre-stage of the predistortion circuit 20.

Figure 12:
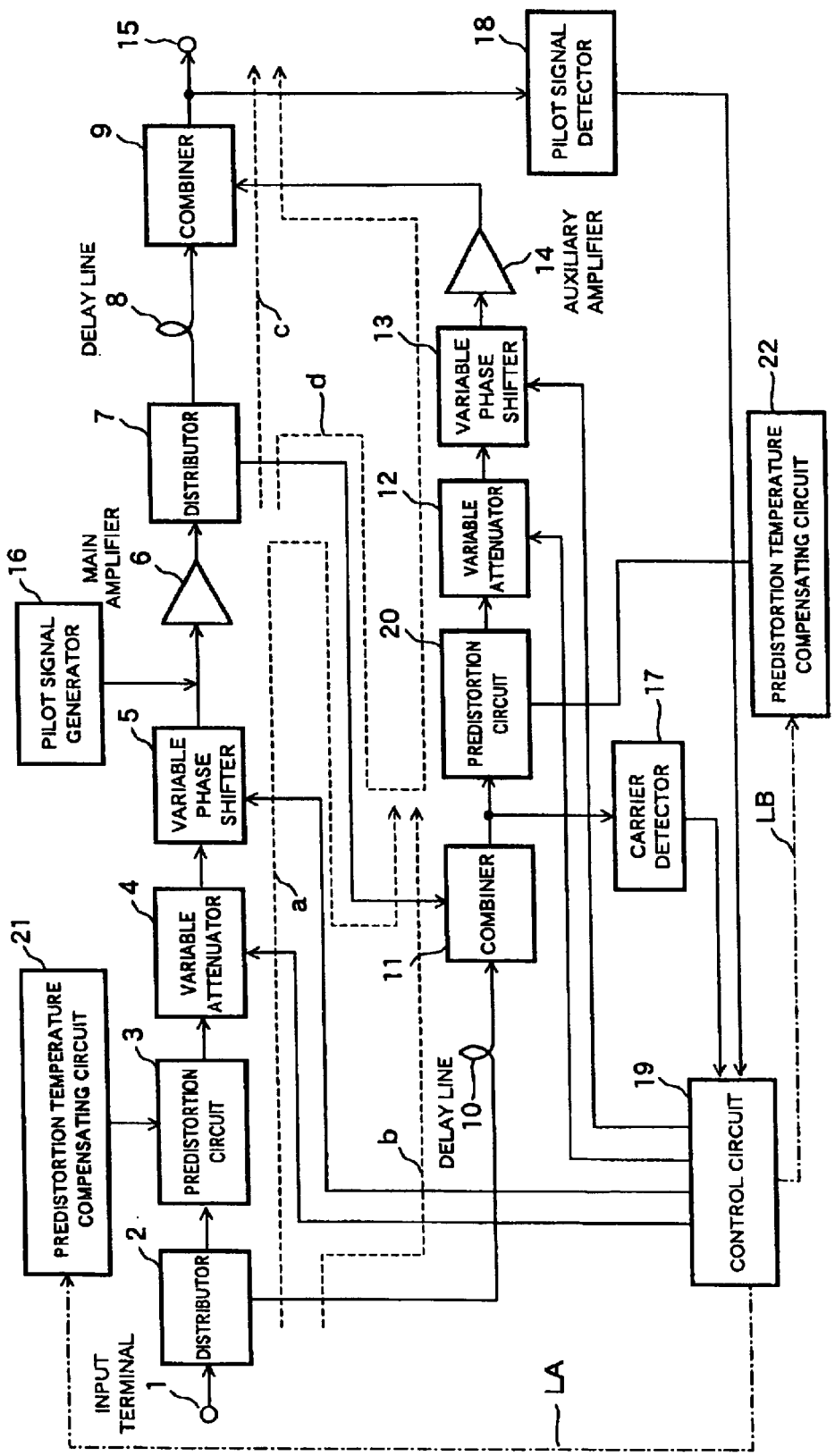
FIG. 12 is a schematic block diagram showing a still further feedforward amplifier circuitry.
Figure 3:
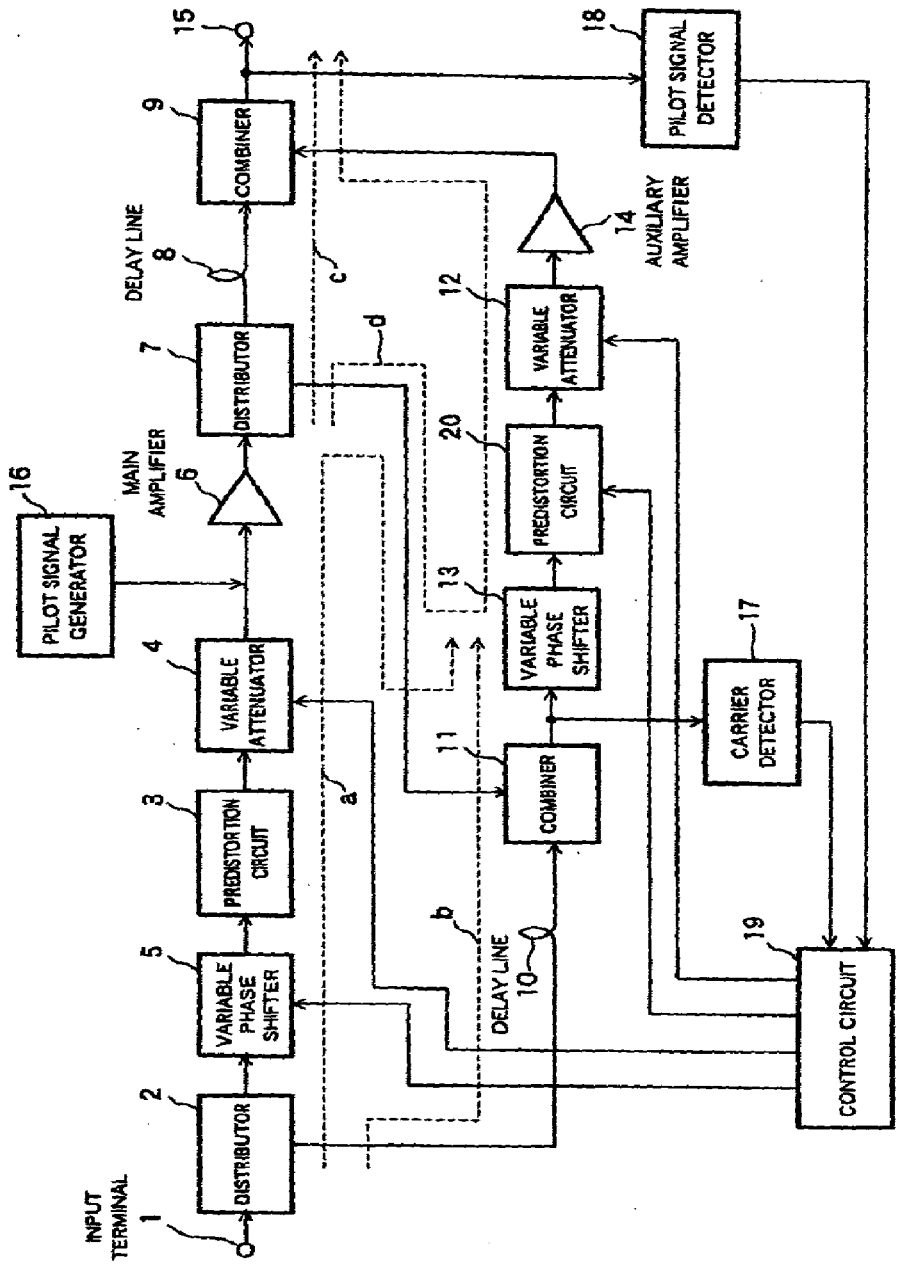
Figure 9:
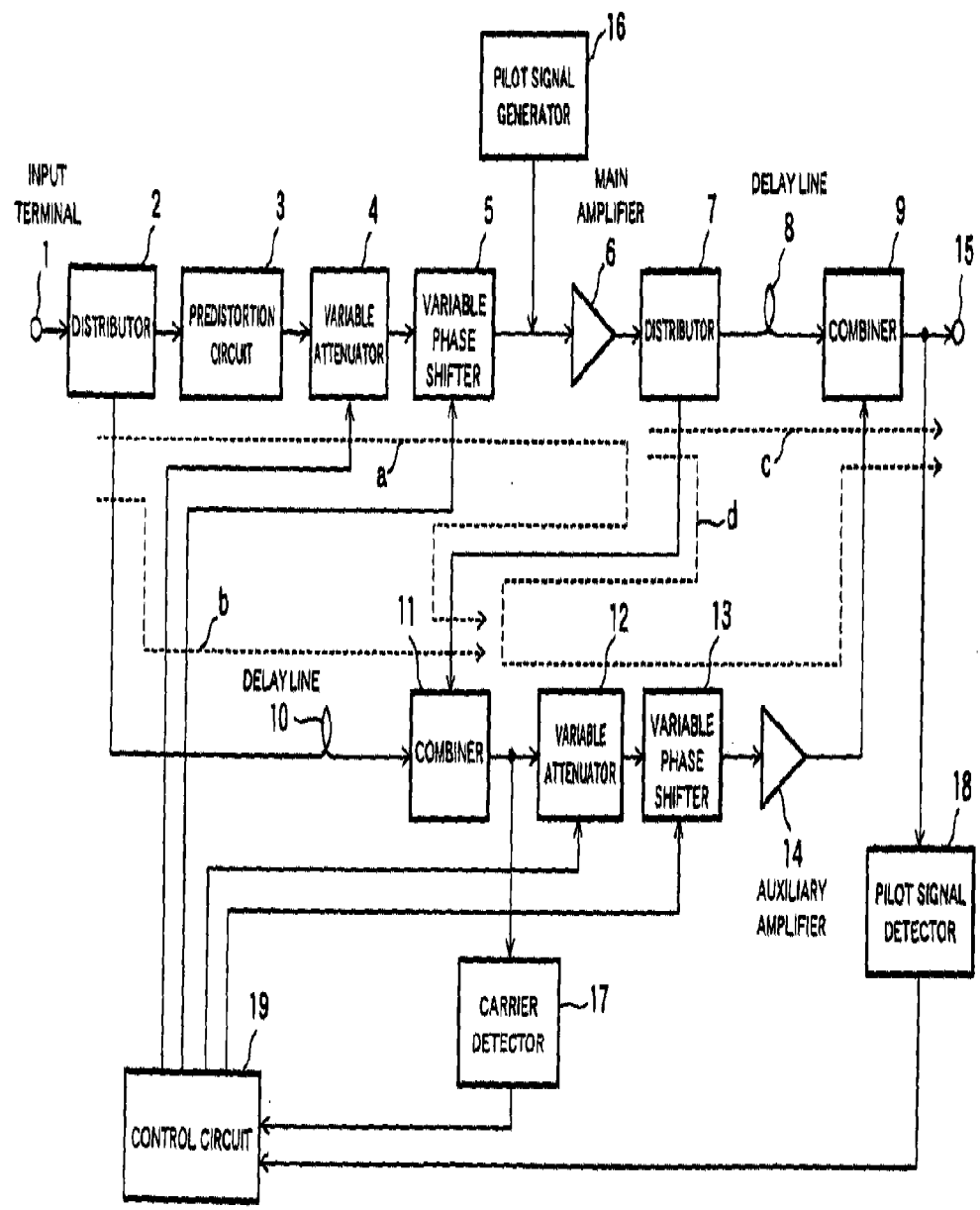
Figure 10:
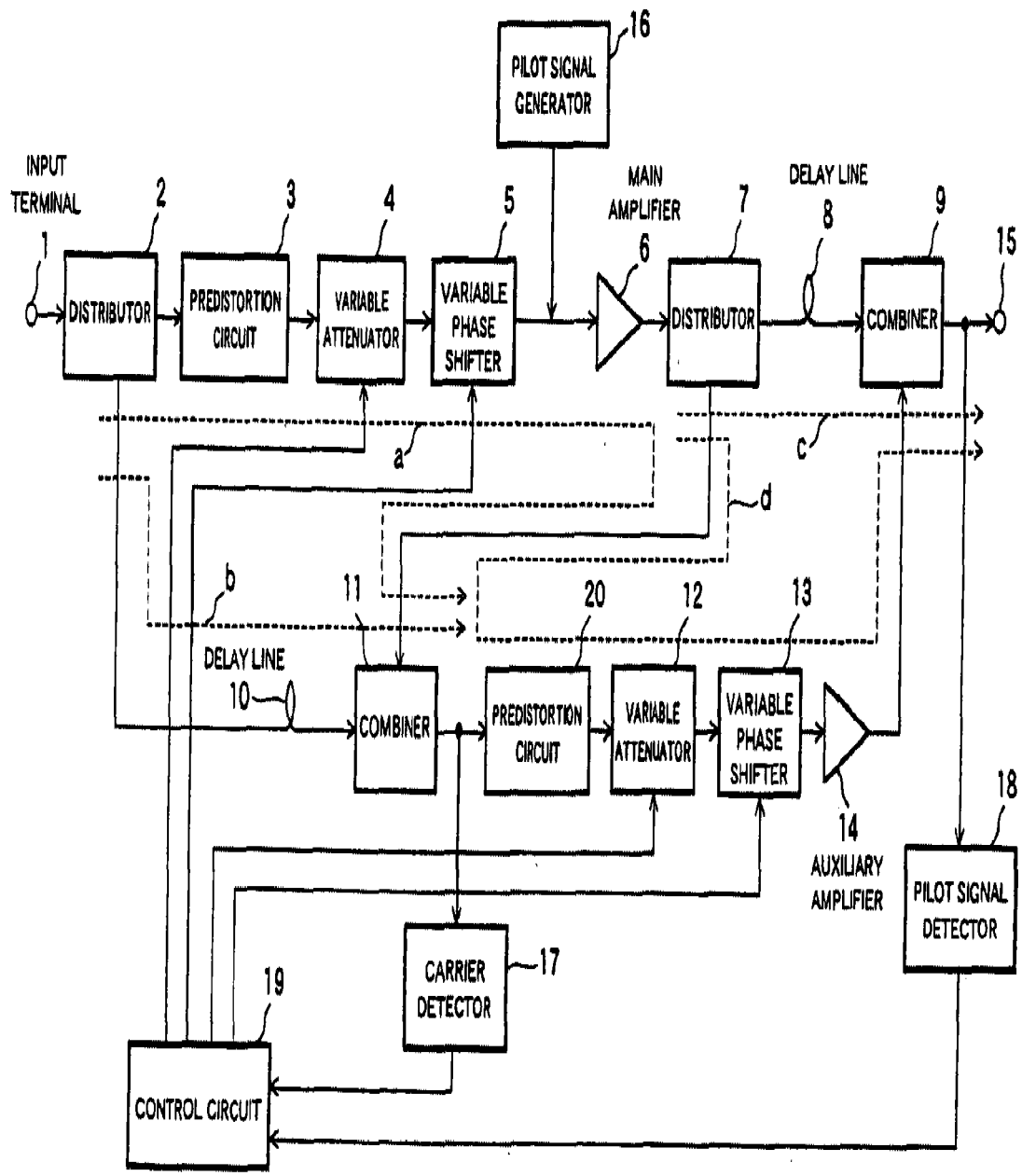
Figure 11:
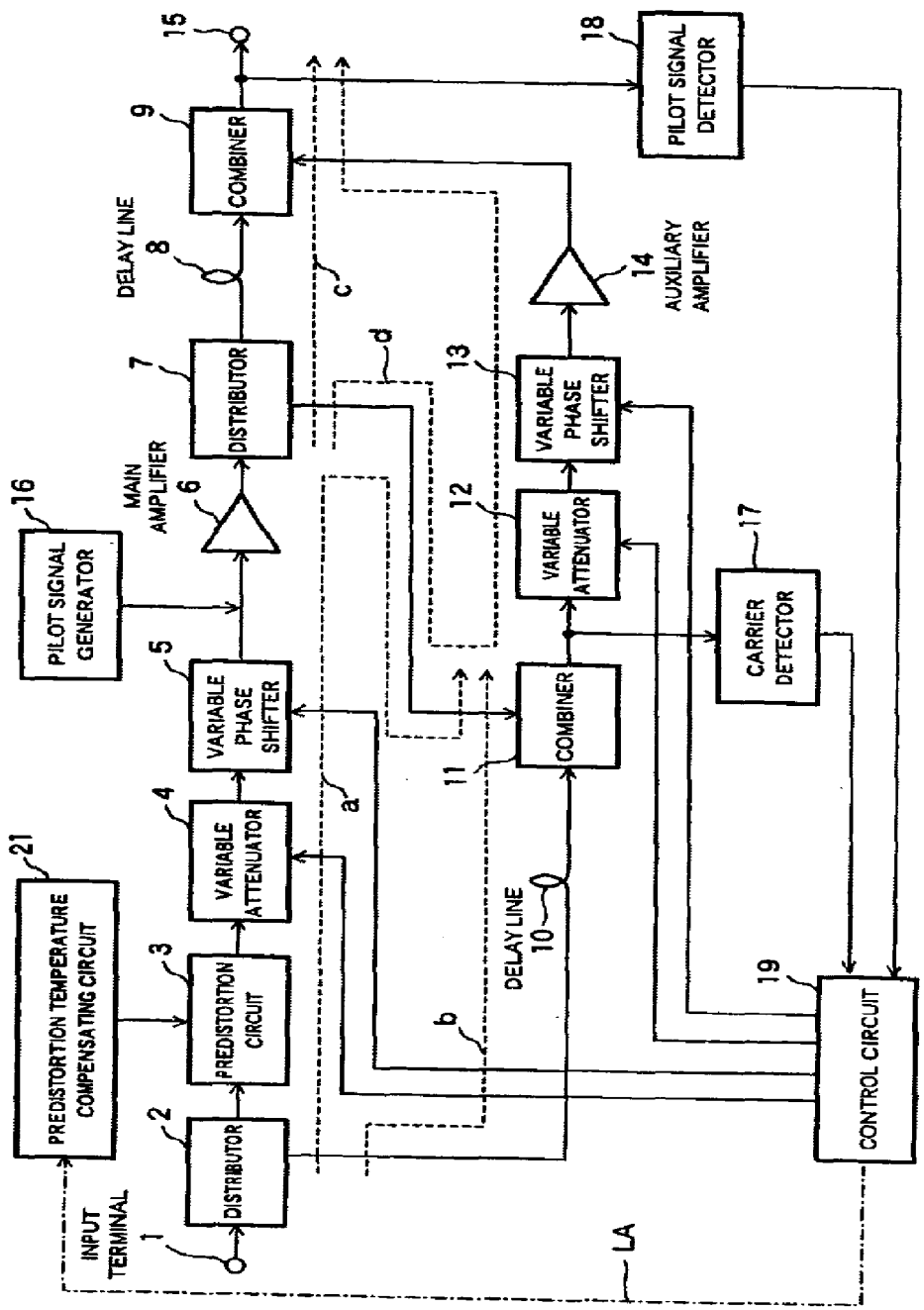
Figure 12:
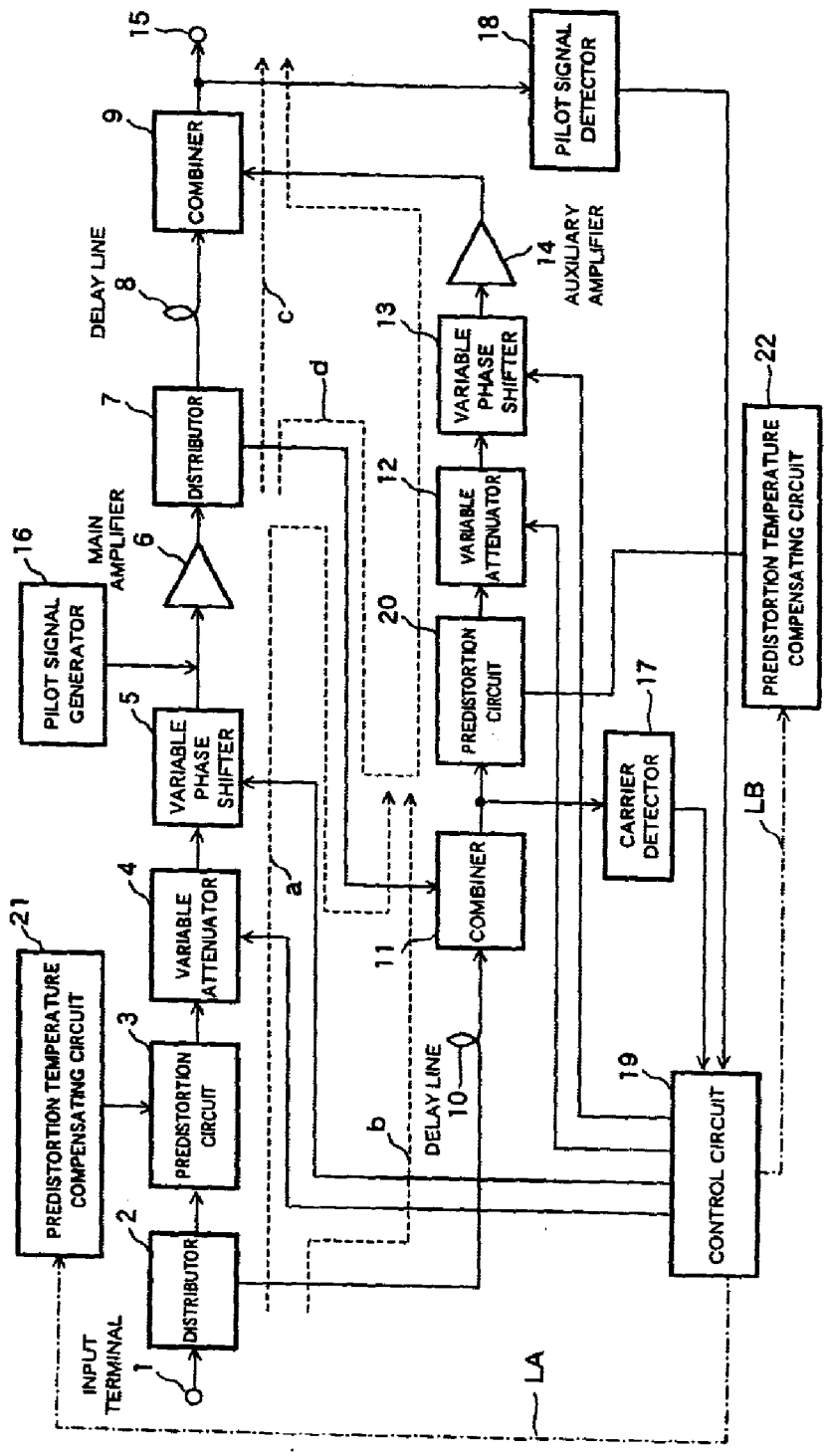

In the feedforward amplifier circuitry of FIG. 7 thus configured, the variable phase shifters 5 and 13 are different in their locations than those of the feedforward amplifier circuitry of FIG. 12. However, the feedforward amplifier circuitry of FIG. 7 is identical in performance to the feedforward amplifier circuitry of FIG. 12. In addition, although the predistortion temperature compensating circuits 21 and 22 independently control the predistortion circuits 3 and 20, respectively, the predistortion temperature compensating circuits 21 and 22 may be configured to control the predistortion circuits 3 and 20 under respective instructions from the control 19 via control lines LA and LB as denoted by one-dotted lines.

Embodiment 8:

FIG. 8 is a schematic block diagram showing a feedforward amplifier circuitry of an embodiment 8 according to the present invention. In comparison with the feed forward amplifier circuitry of FIG. 12, the feedforward amplifier of FIG. 8 is different therefrom in that a variable phase shifter 5 is not disposed on a signal path a but disposed on a signal path b and in that a variable phase shifter 13 is not disposed on a signal path a but disposed on a signal path c. Accordingly, a control circuit 19 of FIG. 8 controls the variable phase shifter 5 disposed on the signal path b such that a signal on the signal path a becomes opposite in phase to a signal on the signal path b. Also, the control circuit 19 of FIG. 8 controls the variable phase shifter 13 disposed on the signal path c such that a signal on the signal path c becomes opposite in phase to a signal on the signal path d. In the feedforward amplifier circuitry of FIG. 8 thus configured, the variable phase shifters 5 and 13 are different in their locations than those of the feedforward amplifier circuitry of FIG. 12. However, the feedforward amplifier circuitry of FIG. 8 is identical in performance to the feedforward amplifier circuitry of FIG. 12.

As is clear from the embodiments 1 to 8 as described above, in the configuration of distortion detecting means comprised of the distributor 2 through the combiner 11 and distortion eliminating means comprised of the distributor 7 through the combiner 9, the variable phase shifters 5 and 13 can be disposed not only on the post-stage of predistortion circuits 3 and 20, respectively, but also be disposed on respective appropriate locations at which a distortion detection and a distortion elimination are enabled. Therefore, the invention provides a designer with more flexibility in changing the location of variable shifter, regardless of the conventional arrangement of the variable phase shifter disposed on the post-stage of the distortion circuit, when a feedforward amplifier is actually designed.

Thus, the feedforward amplifier circuitry according to the present invention as configured above, if there is provided therein the pre-stage distortion compensating means, allows the variable phase shifter to be disposed on a location other than the post-stage of the pre-stage distortion compensating means without any reverse influence on the feedforward amplifier circuit. Therefore, the present invention provides an advantageous effect in that the variable phase shifter can be disposed on an appropriate location regardless of the conventional arrangement of the variable phase shifter disposed on the post-stage of the distortion circuit.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A feedforward amplifier circuitry, comprising:
   a first distributor which is connected to an input terminal and which distributes an input signal from said input terminal to two outputs;
   a first variable phase shifter which is connected to one of said two outputs of said first distributor and which variably shifts a phase;
   a pre-stage distortion circuit which is connected to an output of said first variable phase shifter and which compensates a distortion;

a first variable attenuator which is connected to an output of said pre-stage distortion circuit and which variably sets a distortion rate;

a main amplifier connected to an output of said first variable attenuator;

a pilot signal generator injecting a pilot signal between said first variable attenuator and said main amplifier;

a second distributor which is connected to an output of said main amplifier and which distributes an output of said main amplifier to two outputs;

a first delay line which is connected to one of said two outputs of said second distributor and which delays an output signal from said second distributor;

a second delay line which is connected to the other of said two outputs of said first distributor and which delays an output signal from said other of said two outputs of said first distributor;

a second combiner which is connected to an output of said second delay line and the other output of said two outputs of said second distributor and which combines the signal inputted therefrom;

a second variable attenuator which is connected to an output of said second combiner and which variably sets a distortion rate;

a second variable phase shifter which is connected to an output of said second variable attenuator and which variably shifts a phase;

an auxiliary amplifier connected to an output of said second variable phase shifter;

a first combiner which is connected to an output of said auxiliary amplifier and an output of said delay line and which combines the signal inputted therefrom;

a pilot signal detector which is provided in an output of said first combiner and which detects a pilot signal; and a control unit controlling said first variable phase shifter, said second variable phase shifter, said first variable attenuator and said second variable attenuator based on a detection result outputted by said pilot signal detector.

2. The feedforward amplifier circuitry according to claim 1, wherein said pre-stage distortion circuit includes a temperature compensating circuit which compensates a temperature.

* * * * *

UNITED STATES PATENT AND TRADEMARK OFFICE
CERTIFICATE OF CORRECTION

PATENT NO.   : 6,774,716 B2
DATED        : August 10, 2004
INVENTOR(S)  : Masaki Suto It is certified that error appears in the above-identified patent and that said Letters Patent is hereby corrected as shown below:

Drawings:
Drawing sheets, consisting of Fig. 3, and Fig. 9-12, should be deleted and replaced with the drawing sheets, consisting of Fig. 3, and Fig 9-12, as shown on the attached pages.

Signed and Sealed this

Thirtieth Day of November, 2004

JON W. DUDAS
*Director of the United States Patent and Trademark Office*